United States Patent

Yamamura

[11] Patent Number: 5,784,321
[45] Date of Patent: Jul. 21, 1998

[54] SEMICONDUCTOR MEMORY DEVICE WITH REDUNDANT CIRCUIT

[75] Inventor: Yasushi Yamamura, Nagasaki, Japan

[73] Assignee: Sony Corporation, Japan

[21] Appl. No.: 773,254

[22] Filed: Dec. 23, 1996

[30] Foreign Application Priority Data

Dec. 26, 1995 [JP] Japan .................................. 7-338947

[51] Int. Cl.$^6$ ...................................................... G11C 7/00
[52] U.S. Cl. ............................................. 365/200; 365/201
[58] Field of Search ............................ 365/200, 194, 365/230.06, 201

[56] References Cited

U.S. PATENT DOCUMENTS 5,430,678  7/1995  Tomita .................................. 365/200
5,523,974  6/1996  Hirano ................................. 365/200
5,539,698  7/1996  Suzuki ................................. 365/200
5,555,212  9/1996  Toshiaki ............................... 365/200
5,561,632  10/1996  Arase ................................... 365/200

Primary Examiner—A. Zarabian
Attorney, Agent, or Firm—Ronald P. Kananen

[57] ABSTRACT

A semiconductor memory device in a semiconductor memory circuit with a redundant memory, in which a redundant memory cell compulsory selection circuit is provided and a redundant memory cell compulsory selection signal and a redundant memory address are given from an external portion, whereby after performing the inspection of the redundant memory cell array in advance, the defective row or defective column of the normal memory cell array can be set to a position of the redundant memory cell array not including a defect.

5 Claims, 3 Drawing Sheets

PRIOR ART

SEMICONDUCTOR MEMORY DEVICE WITH REDUNDANT CIRCUIT

BACKGROUND OF THE INVENTION

1. Field of the Invention

The present invention relates to a semiconductor memory device having a redundant circuit.

2. Description of the Related Art

In recent years, advances in miniaturization techniques have led to an increasingly higher degree of integration of semiconductors and practical application of semiconductor memory devices with large capacities. On the other hand, the increase of the memory capacity of memory chips has led to a greater probability of memory cells having defects. This has become a major cause in the reduction of the yield of a memory chip.

In order to deal with defective memory cells which are the main cause of the reduction of the yield, use is made of a so-called redundant circuit system in which the memory chip is provided in advance with memory cells which can be used to replace defective memory cells in a circuit according to need.

The unit of replacement is a row or a line of an array of memory cells along the word line or bit line in the memory cell array.

The replacement of a row of memory cells along the word line including the defective memory cell in the redundant circuit or a column of memory cells along the bit line is carried out by recording the address of the defective row or defective column in a decoder used for selecting the redundant word line or redundant bit line. Specifically, the method of blowing a fuse by a laser or overcurrent has been known.

However, since the redundant memory cells are selected irreversibly by the blowing of a fuse, if part of the normal memory cells are replaced with the redundant memory cells, and there are defects in the redundant memory cells, it becomes impossible to eliminate the defect in the end irrespective of the redundant cells.

The increasing capacity of memory chips has also been accompanied by an increase in the surface area occupied by the redundant memory cells and this a greater probability of defective memory cells in the redundant memory. For this reason, even if the defective memory cells of the normal memory cell array are replaced by the redundant memory cells, the probability that defective cells will be included in these redundant memory cells per se becomes high and so the rate of success in replacing defective memory cells will be lowered.

SUMMARY OF THE INVENTION

An object of the present invention is to provide a semiconductor memory device which enables defects in a redundant memory cell to be discovered by non-destructive inspection and enables an improvement of the rate of success of replacement of defective memory cells. The above object can be achieved by detecting the defects in the redundant memory cell array before the redundancy processing by compulsorily selecting the redundant memory cells with a selection circuit, performing non-destructive inspection, and replacing the normal memory cells including the defective cells with the redundant memory cell not including defective cells.

Accordingly, the present invention provides a semiconductor memory device comprising normal word lines; normal bit lines; a normal memory cell array in which a plurality of memory cells are arranged in the form of a matrix at intersecting points of the word lines and bit lines; a normal row selection decoder for selectively driving the normal word lines; a normal column selection decoder which selectively connects the normal bit lines to an input and output (input/output) circuit; a redundant memory cell array including at least one redundant memory cell for replacement of the normal memory cell; a redundancy selection circuit for recording and recoding defective addresses and selecting a predetermined memory cell in the redundant memory cell array in place of the access to a defective memory cell when the defective address of the normal memory cell array is selected; and a redundancy compulsory selection circuit which makes the normal memory cell array be nonselected by an external redundant compulsory selection signal and an external redundant memory address signal and selects the predetermined memory cell in the redundant memory cell array.

Preferably, the redundancy selection circuit comprises a redundant row selection circuit for selecting a row of the redundant memory cell array in response to the external redundant memory address signal; and the normal column selection decoder selects a column of the redundant memory cell array.

Alternatively, the redundancy selection circuit comprises a redundant row selection circuit for selecting a column of the redundant memory cell array in response to the external redundant memory address signal; and the normal row selection decoder selects a row of the redundant memory cell array.

Alternatively, the redundancy selection circuit comprises a redundant row selection circuit and a redundant column selection circuit; the redundant memory cell array comprises a redundant memory row array and a redundant memory column array; when the row of the redundant memory row array is selected in response to the external redundant memory address signal, the column selection of the redundant memory cell array is carried out by the normal column selection decoder; and when the column of the redundant memory column array is selected in response to the external redundant memory address signal, the row selection of the redundant memory cell array is carried out by the normal row selection decoder.

Preferably, the inspection of the redundant memory cell array is carried out in advance; and the address of the redundant memory cell array for replacing a defective address of the normal memory cell array is set as a defect-free address.

BRIEF DESCRIPTION OF THE DRAWINGS

These and other objects and features of the present invention will become more apparent from the following description of the preferred embodiments given with reference to the attached drawings, wherein.

DESCRIPTION OF THE PREFERRED EMBODIMENTS

Figure 1:
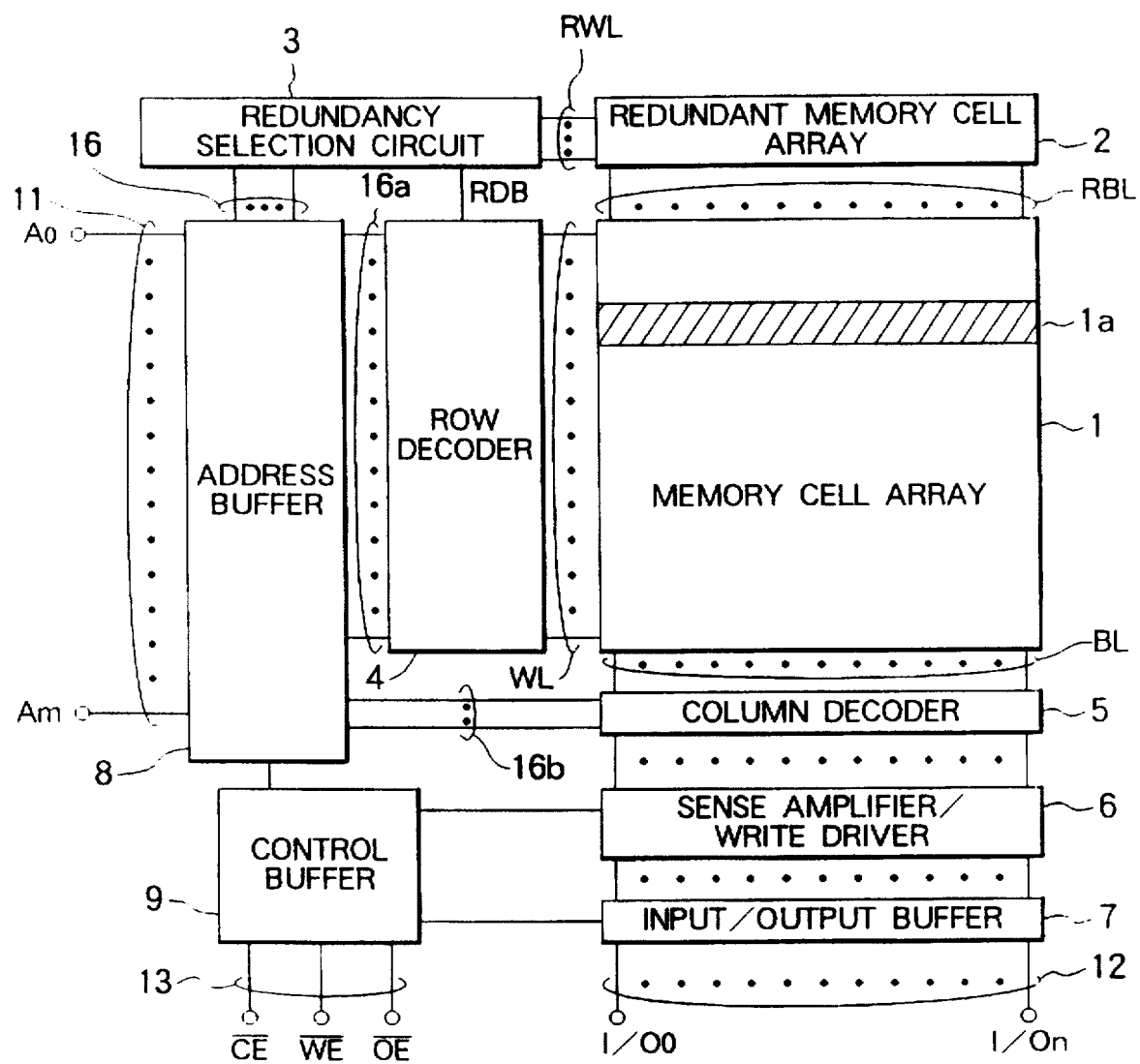
FIG. 1 is a circuit diagram of the configuration of a general semiconductor memory device.

FIG. 1 is a circuit diagram of a general semiconductor memory device.

In the figure, 1 denotes a memory cell array, 2 a redundant memory cell array, 3 a redundancy selection circuit, 4 a row decoder, 5 a column decoder, 6 a sense amplifier and write driver (sense amplifier/write driver), 7 an input and output buffer (input/output buffer), 8 an address buffer, 9 a control buffer, 16, 16a, and 16b denote address signal lines, WL denotes word lines, BL denotes bit lines, RWL denotes redundant word lines, and RBL denotes redundant bit lines.

$A_0, \ldots, A_m$ denote address signals input to an address input terminal 11, $I/O_0, \ldots, I/O_n$ denote input/output data input to or output from the data input/output terminal 12, and $\overline{CE}, \overline{WE},$ and $\overline{OE}$ denote control signals input to a control signal terminal 13 of a control buffer 9 such as a chip enable, a write enable and an output enable signal.

In the memory cell array 1, 1a denotes a defective memory cell row including a memory cell having a defeat.

As illustrated, address signals $A_0, \ldots, A_m$ are input to the address buffer 8, part of these signals are input via the address signal line 16a to a row decoder 4, a word line to which the memory cell designated by the address signals $A_0, \ldots, A_m$ is connected is selected by the row decoder 4, and the selected word line becomes active.

Part of the address signals $A_0, \ldots, A_m$ input to the address input terminal 11 are input via the address signal line 16b to the column decoder 5. The bit line to which the memory cell designated by the address signals $A_0, \ldots, A_m$ is connected is selected by the column decoder 5. In this way, the memory cell designated by the address signals $A_0, \ldots, A_m$ input to the address buffer 8 is selected.

At the time of reading, the data stored in the memory cell designated by the address signal is amplified by the sense amplifier/write driver 6 and further output via the input/output buffer to the predetermined terminal of the data input/output terminal 12.

The write data $I/O_0, \ldots, I/O_n$ input to the data input/output terminal 12 at the time of writing are input to the column decoder 5 via the input/output buffer 7 and the sense amplifier/write driver and further input to the bit line selected by the column decoder 5. Further, the predetermined word line is selected by the row decoder 4. The address signals $A_0, \ldots, A_m$ are supplied to the row decoder 4 and the column decoder 5, the designated memory cell is selected, and the data is written. Note that, the above reading and writing operation is controlled by the control signals $\overline{CE}, \overline{WE},$ and $\overline{OE}$ input via the control buffer 9.

Where, for example, a defective memory cell row 1a, including a memory cell having a defect, exists in the memory cell array 1, this memory cell row is replaced by the memory cell row existing in the redundant memory cell array 2. Then, by a method such as the blowing of the fuse by a laser or overcurrent mentioned before, when the defective memory cell row 1a is designated by the address signals $A_0, \ldots, A_m$, the memory cell row for replacement existing in the redundant memory cell array 2 is designated instead.

This replacement operation is carried out by a redundancy selection circuit 3. As a result of the blown fuse, when the defective memory cell row 1a is designated by the address signals $A_0, \ldots, A_m$, a row decoder nonselect signal RDB reaches an active state and is input to the row decoder 4 from the redundancy selection circuit 3. The selection operation of the row decoder 4 is then restricted. The defective memory cell row 1a is no longer selected by the row decoder 4, and a replacement memory cell row is selected from the redundant memory cell array 2 by the redundancy selection circuit 3 instead.

As a result, even if a memory cell having a defect exists in the memory cell array 1, the redundant memory cell array 2 is used to replace the memory cells in units of, for example, rows. At the time of access to the memory cells, when the defective memory cell row 1a having a defect is designated by the address signals $A_0, \ldots, A_m$, the memory cell row for replacement is selected from the redundant memory cell array 2 by the redundancy selection circuit 3 in place of the defective memory cell row 1a.

Figure 2:
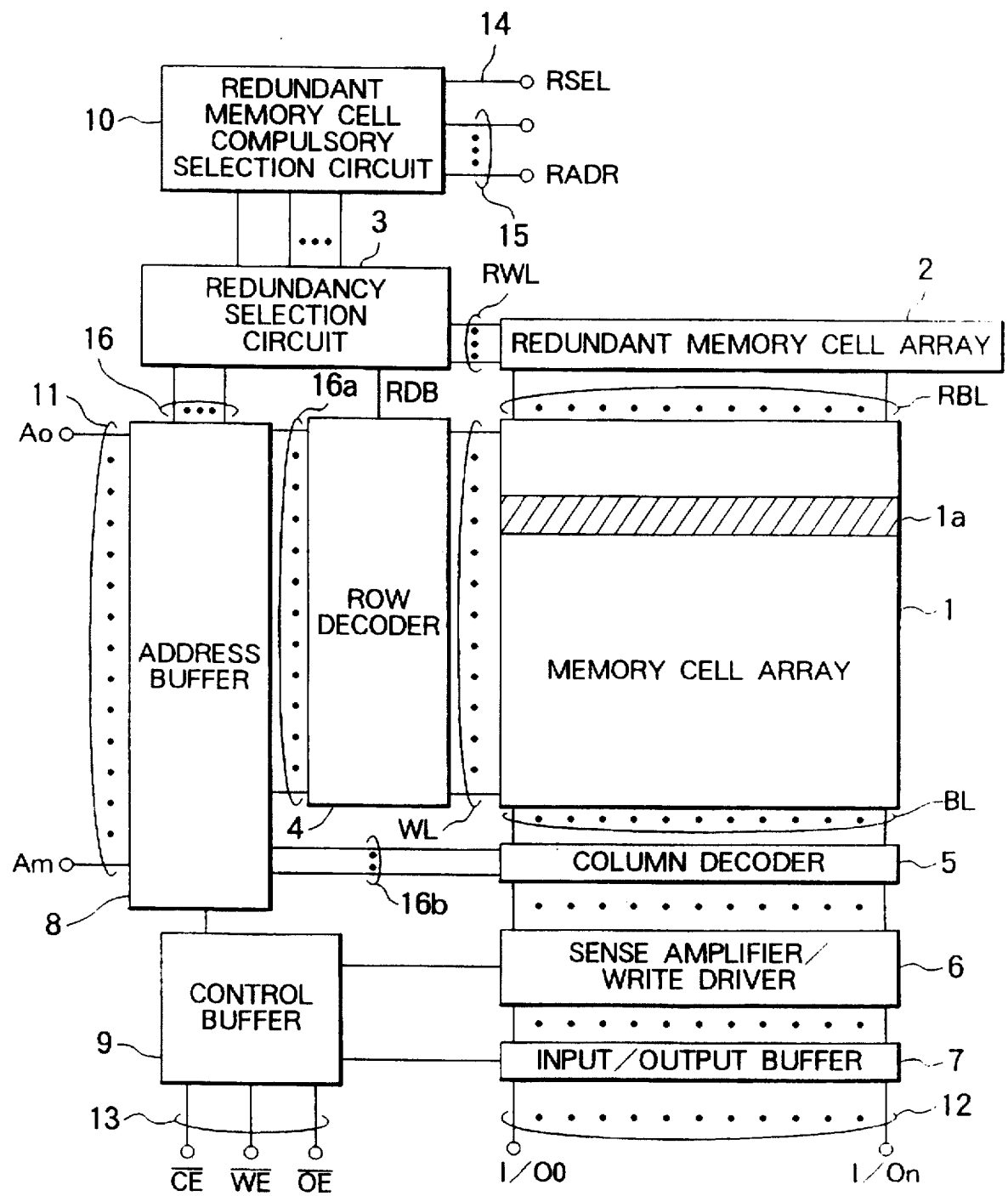
FIG. 2 is a circuit diagram of an embodiment of a semiconductor memory device according to the present invention.

FIG. 2 is a circuit diagram of an embodiment of the semiconductor memory device according to the present invention. In FIG. 2, 1 denotes a memory cell array, 2 a redundant memory cell array, 3 a redundancy selection circuit, 4 a row decoder, 5 a column decoder, 6 a sense amplifier/write driver, 7 an input/output buffer, 8 an address buffer, 9 a control buffer, 10 a redundant memory cell compulsory selection circuit, 16, 16a, and 16b denote address signal lines, WL denotes word lines, BL denotes bit lines, RWL denotes redundant word lines, and RBL denotes redundant bit lines.

Further, $A_0, \ldots, A_m$ denote address signals input to an address input terminal 11, $I/O_0, \ldots, I/O_n$ denote input/output data input to or output from the data input/output terminal 12, $\overline{CE}, \overline{WE},$ and $\overline{OE}$ denote respectively the chip enable signal, the write enable signal, and an output enable signal input to the control signal terminal 13 of the control buffer 9, RSEL denotes a redundant memory cell compulsory selection signal (compulsory selection signal) input to the redundant memory compulsory selection signal input terminal 14 of the redundant memory cell compulsory selection circuit 10, and RADR denotes a redundant memory address (redundant address signal) input to a redundant memory address input terminal 15 of the redundant memory cell compulsory selection circuit 10.

Further, in the memory cell array 1, 1a denotes a defective memory cell row including the memory cell having a defect.

The redundant memory selection circuit 3 selects the replacement use redundant memory cell row for the defective memory cell row 1a from the redundant memory cell array 2 when the defective memory cell row 1a of the memory cell array 1 is indicated as defective by, for example, a blown fuse in response to a particular address signal and, at the same time, outputs the row decoder nonselect signal RDB to the row decoder 4 and restricts the selection operation of the row decoder 4.

The circuit for compulsorily selecting a redundant memory cell (redundant memory cell compulsory selection circuit) 10 selects the redundant memory cell from the redundant memory cell array 2 in accordance with the redundant memory cell compulsory selection signal RSEL and the redundant memory address RADR irrespective of the information of the blown fuse of the redundancy selection circuit 3.

The address data $A_0, \ldots, A_m$ input to the address input terminal 11 are partially input to the address signal line 16a via the address buffer 8 and input to the row decoder 4. The other one part is input to the address signal line 16b and input to the column decoder 5.

The row decoder 4 selects the word line to which the memory cell designated by the address data is connected from among the word lines WL in accordance with one part of the address data $A_0, \ldots, A_m$ input to the address signal line 16a and sets the selected word line to the active state.

The selection operation of the row decoder 4 is controlled by the row decoder nonselect signal RDB input to it. For example, when the row decoder nonselect signal RDB of a high level is input to the row decoder 4, the selection operation of the row decoder 4 is restricted, and the memory cell row addressed is not selected from the memory cell array 1. On the other hand, when the row decoder nonselect signal RDB of a low level is input to the row decoder 4, the selection operation of the row decoder 4 is allowed, and the word line to which the designated memory cell is connected is set in the active state in accordance with the input address data $A_0, \ldots, A_m$.

The column decoder 5 selects the bit line to which the memory cell designated from the bit line BL is connected in accordance with the part of the address data $A_0, \ldots, A_m$ input to the address signal line 16b and sets the selected bit line in the active state.

Further, when the redundant memory cell array 2 is accessed, the column decoder 5 selects the redundant bit line to which the designated redundant memory cell is connected from among the redundant bit lines RBL in accordance with the address data input to the address signal line 16b and sets the selected redundant bit line to the active state.

The sense amplifier/write driver 6 amplifies the data of the bit line selected by the column decoder 5 at the time of reading and outputs this to the input/output buffer 7. At the time of writing, it amplifies the write data input from the input/output buffer 7 and outputs this to the bit line selected by the column decoder 5.

The input/output buffer 7 latches the read data output from the sense amplifier/write driver 6 at the time of reading and outputs the latched data to the input/output data terminal 12. At the time of writing, it latches the write data input to the input/output terminal 12 and outputs the latched data to the sense amplifier/write driver 6.

The address buffer 8 latches the address data $A_0, \ldots, A_m$ input to the address input terminal 11 and outputs the latched address data to the redundancy selection circuit 3, the row decoder 4, and the column decoder 5.

The control buffer 9 latches the control signals $\overline{CE}$, $\overline{WE}$, and $\overline{OE}$ input to the control signal terminal 13 and outputs the same to the sense amplifier/write driver 6, the input/output buffer 7, and the address buffer 8, respectively.

During normal operation, in accordance with the address data $A_0, \ldots, A_m$ input to the address input terminal 11, the memory cell designated from the memory cell array 1 is selected by the row decoder 4 and the column decoder 5 and the selected memory cell is accessed.

For example, at the time of reading, the data stored in the selected memory cell is amplified by the sense amplifier/write driver 6 via the selected bit line and further output to the data input/output terminal 12 via the input/output buffer 7.

At the time of writing, the write data input to the terminal corresponding to the bit line selected by the input/output data terminal is input to the sense amplifier/write driver 6 via the input/output buffer 7, amplified by the sense amplifier/write driver 6 and then written in the designated memory cell via the selected bit line.

Note that, the above read operation and write operation are controlled by the control signals $\overline{CE}$, $\overline{WE}$, and $\overline{OE}$ input via the control buffer 9.

As shown in FIG. 2, where, for example, a memory cell having a defect is detected in the memory cell array 1, in the redundancy selection circuit 3, the address of the defective memory cell is recorded by fuse blowing etc. By this, for example, where the memory cell existing in the defective memory cell row 1a is designated by the input address data $A_0, \ldots, A_m$, in accordance with the information of the blown fuse and the address data $A_0, \ldots, A_m$, the predetermined memory cell row is selected from the redundant memory cell array 2 by the redundancy selection circuit 3 and is used to replace the defective memory cell row 1a existing in the memory cell array 1.

For example, where a memory cell existing in the defective memory cell row 1a is designated by the address data $A_0, \ldots, A_m$ input to the address input terminal 11, the redundancy selection circuit 3 selects the redundant word line of the memory cell row replacing the defective memory cell row 1a in the redundant memory cell array 2 from among the redundant word lines RWL in accordance with the address data input to the address signal line 16 and sets this to the active state. By the column decoder 5, the redundant bit line corresponding to the designated memory cell is selected from among the redundant bit lines RBL, and this is set to the active state.

As illustrated, the row decoder nonselect signal RDB is provided in the row decoder 4. When a memory cell existing in the defective memory cell row 1a in the memory cell array 1 is designated by the address data $A_0, \ldots, A_m$, the memory cell row replacing the defective memory cell row 1a is selected from the redundant memory cell array 2 by the redundancy selection circuit 3 and, at the same time, the row decoder nonselect signal RDB is output to the row decoder 4 and the selection operation of the row decoder 4 is restricted.

As a result, in place of the defective memory cell row 1a, the replacement use redundant memory cell row is selected from the redundant memory cell array 2 and the designated redundant memory cell is accessed.

Conventionally, the memory cell row of the redundant memory cell array 2 is made to replace the defective memory cell row 1a existing in the memory cell array 1 by the method of blowing a fuse existing in the redundancy selection circuit 3 etc., therefore, after the replacement is once set, return to the original state is impossible. Namely, the redundant memory cells cannot be accessed without the irrevocable blowing of a fuse.

In the present embodiment, as shown in FIG. 2, a redundant memory cell compulsory selection circuit 10 is provided. By this redundant memory cell compulsory selection circuit 10, any memory cell row of the memory cell array 1 can be replaced by a memory cell row of the redundant memory cell array 2. This set-up of the replacement row can be performed many times without destruction.

Below, a detailed explanation will be made of the operation of the redundant memory cell compulsory selection circuit 10 referring to the circuit diagram shown in FIG. 3.

Figure 3:
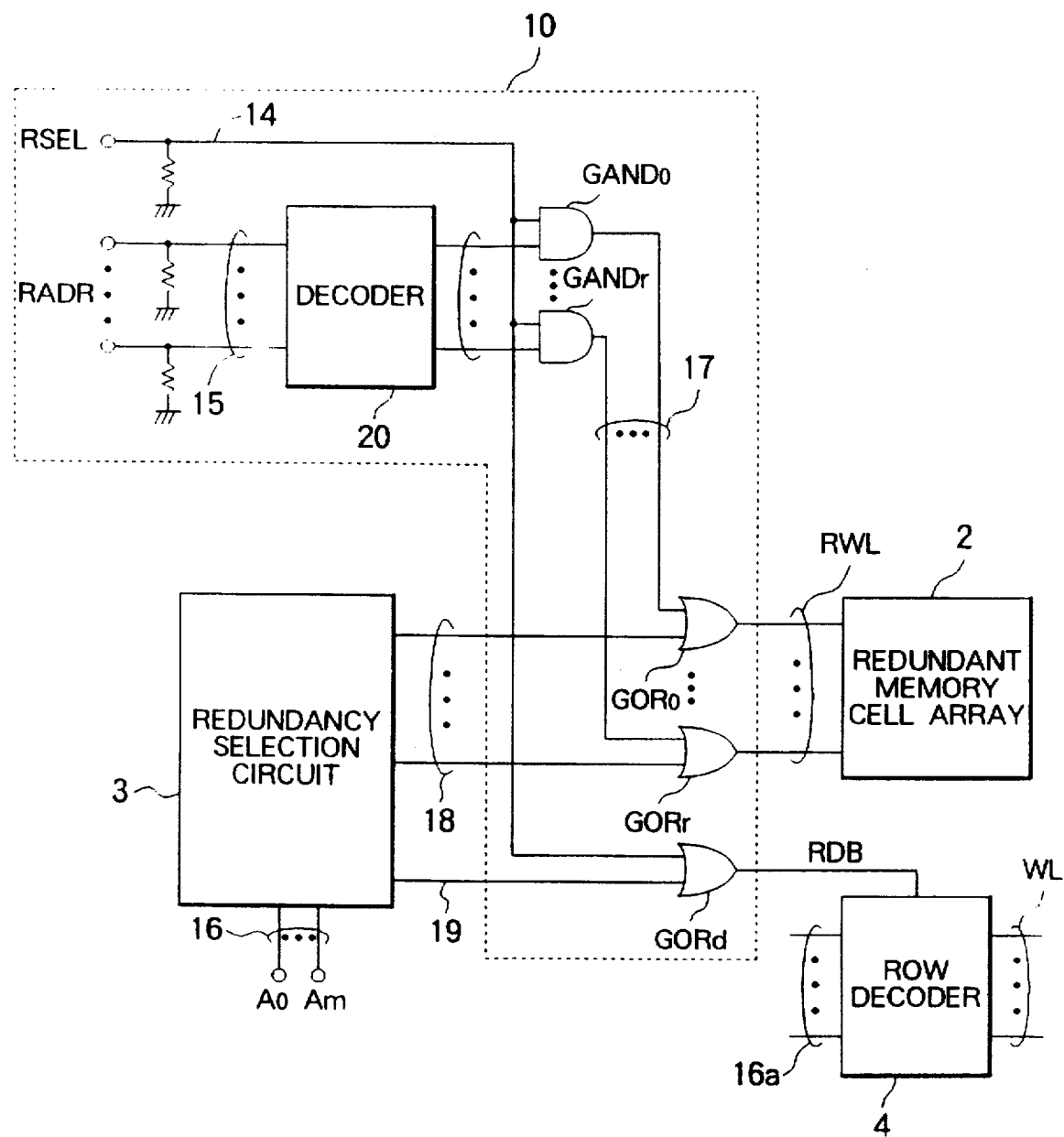
FIG. 3 is a view of the circuit configuration regarding selection of a redundant memory cell array by a redundant memory selection circuit and a redundancy selection circuit used in FIG. 2.

FIG. 3 is a circuit diagram showing the internal configuration of the redundant memory cell compulsory selection circuit 10.

In FIG. 3, $GAND_0, \ldots, GAND_r$ denote AND gates, $GOR_0, \ldots, GOR_r, GOR_d$ denote OR gates, RSEL denotes a redundant memory cell compulsory selection signal, RADR denotes a redundant memory address, 14 denotes an input terminal of the redundant memory cell compulsory selection signal RSEL, 15 denotes an input terminal of the redundant memory address RADR, 17 denotes output terminals of AND gates $GAND_0, \ldots, GAND_r$, 18 a redundant memory selection signal output terminal of the redundancy selection circuit 3, 19 denote a row decoder nonselect signal output terminal of the redundancy selection circuit 3, 20 denotes a redundant memory decoder, RWL denotes redundant memory cell array word lines, and RDB denotes a row decoder nonselect signal input to the row decoder 4.

The input terminal of the redundant memory decoder 20 is connected to the redundant memory address input terminal 15, and the output terminals are connected to one input terminals of the AND gates $GAND_0, \ldots, GAND_r$. The other input terminals of these AND gates $GAND_0, \ldots, GAND_r$ are connected to the redundant memory compulsory selection signal input terminal 14.

The output terminals 17 of the AND gates $GAND_0, \ldots GAND_r$ are connected to one input terminals of the OR gates $GOR_0, \ldots, GOR_r$, and the other input terminals of the OR gates $GOR_0, \ldots, GOR_r$ are connected to the redundant memory selection signal output terminal 18 of the redundancy selection circuit 3.

Further, one input terminal of the OR gate $GOR_d$ is connected to the redundant memory compulsory selection signal input terminal 14, and the other input terminal is connected to the row decoder nonselect signal output terminal 19 of the redundancy selection circuit 3.

The output terminals of the OR gates $GOR_0, \ldots, GOR_r$ are connected to the redundant memory word lines RWL of the redundant memory cell array 2, and the output terminal of the OR gate $GOR_d$ is connected to the nonselect signal input terminal of the row decoder 4.

The redundant memory decoder 20 selects the redundant memory cell row selection signal corresponding to the word line of the designated redundant memory cell row in accordance with the input redundant memory address RADR and outputs this to the input terminals of the AND gates $GAND_0, \ldots, GAND_r$.

The redundancy selection circuit 3 generates the redundant memory selection signal corresponding to the redundant memory cell row selected by the address data $A_0, \ldots, A_m$ and the information of the blown fuse in accordance with the address data $A_0, \ldots, A_m$ input to the redundancy selection circuit 3 and outputs them to the redundant memory selection signal output terminal 18. Further, it outputs these redundant memory selection signals to the redundant memory word line RWL of the redundant memory cell array 2 via the OR gates $GOR_0, \ldots, GOR_r$, and selects the designated redundant memory cell row.

Below, the operation based on the configuration of the redundant memory cell compulsory selection circuit 10 will be explained.

When the redundant memory cell is not compulsorily selected, the redundant memory compulsory selection signal input terminal 14 and the redundant memory address input terminal 15 are all set to the ground potential GND. Namely, the redundant memory cell compulsory selection signal RSEL and redundant memory address RADR are all set at the low level. For this reason, all of the output terminals of the AND gates $GAND_0, \ldots, GAND_r$ exhibit the potential of a low level, for example, a ground potential GND, the ground potential is applied to the OR gates $GOR_0, \ldots, GOR_r$, and one input terminal of the OR gate $GOR_d$, and the outputs of these OR gates are determined according to the signal input to the other input terminals.

In this case, the signals of the redundant memory selection signal output terminal 18 of the redundancy selection circuit 3 are transferred via the OR gates $GOR_0, \ldots, GOR_r$ to the output terminals of these OR gates and input to the redundant memory cell array word lines RWL, and the row decoder nonselect signal RDB output to the terminal 19 of the redundancy selection circuit 3 is transferred to the output terminal of the OR gate $GOR_d$ via the OR gate $GOR_d$ and input to the row decoder 4. By this, for example, based on the address data input to the address signal line 16 of the redundancy selection circuit 3 and the information of the blown fuse, the replacement use redundant memory cell row for the defective memory cell row 1a existing in the memory cell array 1 is selected from the redundant memory cell array 2 and the access is carried out accordingly.

Subsequently, without regard as to the information of the blown fuse of the redundancy selection circuit 3, where the access is to be compulsorily performed with respect to a predetermined memory cell in the redundant memory cell array 2, a redundant memory cell compulsory selection signal RSEL of a high level, for example, the power source voltage Vcc level, is input to the redundant memory compulsory selection signal input terminal 14, and the redundant memory address signal RADR in accordance with the redundant memory cell row which should be selected is input to the redundant memory address input terminal 15.

By this, at the output terminal of the redundant memory decoder 20, a selection signal in accordance with the redundant memory cell array row designated by the redundant memory address signal is set to the active state and transferred to the output terminal 17 via the AND gates $GAND_0, \ldots, GAND_r$. Further, it is transferred to the redundant memory word lines RWL via the OR gates $GOR_0, \ldots, GOR_r$, and the word line corresponding to the selected redundant memory cell row in the redundant memory cell array 2 is set in the active state.

Further, simultaneously with this, a signal of a high level is output to the output terminal of the OR gate $GOR_d$, this is input to the row decoder 4 as row decoder nonselect signal, and the selection operation of the row decoder 4 is restricted.

By the above operation, irrespective of the blown fuse of the redundancy selection circuit 3, by inputting the predetermined redundant memory cell compulsory selection signal RSEL and the redundant memory address RADR to the redundant memory compulsory selection signal input terminal 14 and the redundant memory address input terminal 15, the access can be performed with respect to the redundant memory cell designated by the redundant memory address RADR. Further, by changing the redundant memory address RADR, the access can be performed with respect to any redundant memory cell, so it becomes possible to inspect to any redundant memory cell without destroying the fuse of the redundancy selection circuit 3.

By the redundant memory cell compulsory selection circuit 10, the selection is performed with respect to any memory cell row in the redundant memory cell array 2, the predetermined bit line is selected from among the redundant bit lines RBL of the redundant memory cell array 2 designated by the address data $A_0, \ldots, A_m$ by the column decoder 5 shown in FIG. 1, and the access is performed with respect to the designated redundant memory cell.

As explained above, according to the present embodiment, the redundant memory cell compulsory selection circuit 10 is provided in addition to the redundant memory cell array 2 and the redundancy selection circuit 3, the redundant memory cell compulsory selection signal RSEL and the redundant memory address RADR are input to the redundant memory cell compulsory selection circuit 10, and when the redundant memory cell compulsory selection signal RSEL is set in the active state, the redundant memory cell row designated by the redundant memory address RADR is selected from the redundant memory cell array 2 irrespective of the information of the blown fuse of the redundancy selection circuit 3, the designated redundant memory cell is selected together with the bit line selected by the column decoder 5, and the access is performed with respect to the selected redundant memory cell, therefore it becomes possible to inspect the redundant memory cell without destruction, and as a result, the success rate of relief by the redundant memory cell can be improved.

What is claimed is:

1. A semiconductor memory device comprising:

normal word lines;

normal bit lines;

a normal memory cell array in which a plurality of memory cells are arranged in the form of a matrix at intersecting points of said word lines and bit lines;

a normal row selection decoder for selectively driving said normal word lines in response to an address signal;

a normal column selection decoder which selectively connects said normal bit lines to an input and output circuit in response to said address signal;

a redundant memory cell array including at least one redundant memory cell;

a redundancy selection circuit for detecting a defective memory cell in said normal memory cell array and associating an address of said defective memory cell with an address of a replacement cell in said redundant memory cell array; and a redundant memory cell compulsory selection circuit connected between said redundancy selection circuit and said redundant memory array;

wherein said compulsory selection circuit accesses said redundant memory cell array in response to a redundant memory selection signal and a redundant memory address signal to test said cells of said redundant memory cell array.

2. A semiconductor memory device according to claim 1, wherein said redundancy selection circuit receives said address signal and when said address signal contains said address of a defective memory cell, said redundancy selection circuit disables said normal row selection decoder with a disabling signal and accesses said associated replacement cell of said redundant memory cell array.

3. A semiconductor memory device according to claim 1, wherein if an accessed cell of said redundant memory cell array is defective, said redundancy selection circuit will not associate it with a defective memory cell of said normal memory cell array.

4. A semiconductor memory device according to claim 1, wherein said normal row decoder is disabled when said redundant memory selection signal is received by said compulsory selection circuit.

5. A semiconductor memory device according to claim 2, wherein said redundancy selection circuit comprises a redundant row selection circuit through which said redundancy selection circuit selects a redundant word line which corresponds to said replacement cell; and said normal column selection decoder selects a column of said redundant memory cell array which corresponds to said replacement cell.

* * * * *